United States Patent [19]

Akaogi

[11] Patent Number: 5,038,327
[45] Date of Patent: Aug. 6, 1991

[54] DECODER CIRCUIT OF ERASABLE PROGRAMMABLE READ ONLY MEMORY FOR AVOIDING ERRONEOUS OPERATION CAUSED BY PARASITIC CAPACITORS

[75] Inventor: Takao Akaogi, Inagi, Japan

[73] Assignee: Fujitsu Limited, Kawasaki, Japan

[21] Appl. No.: 584,956

[22] Filed: Sep. 18, 1990

[30] Foreign Application Priority Data

Sep. 20, 1989 [JP] Japan .................................. 1-243909

[51] Int. Cl.$^5$ .............................................. G11C 8/02
[52] U.S. Cl. ............................. 365/230.06; 365/185; 307/443; 307/449; 307/452; 307/481
[58] Field of Search ............... 307/452, 443, 449, 481; 365/230.06, 185

[56] References Cited

U.S. PATENT DOCUMENTS

| 4,700,086 | 10/1987 | Ling et al. | 307/452 |
| 4,780,626 | 10/1988 | Guerin et al. | 307/452 |
| 4,827,160 | 5/1989 | Okano | 307/443 |

FOREIGN PATENT DOCUMENTS

| 60-61996 | 4/1985 | Japan | 365/230.06 |
| 61-45496 | 3/1986 | Japan | 365/230.06 |

Primary Examiner—Joseph E. Clawson, Jr.
Attorney, Agent, or Firm—Armstrong, Nikaido, Marmelstein, Kubovcik & Murray

[57] ABSTRACT

A load unit is connected between a high potential power supply line and a decoded output terminal, a plurality of decoder transistors are connected in series between the decoded output terminal and a low potential power supply line, and gates of the decoder transistors are supplied with input signals. A current supply unit is connected to at least one of a plurality of connection points of the decoder transistors, so that capacitors parasitically formed at the connection points of the decoder transistors are not only charged by a current from the load unit, but also charged by a current from a current from the current supply unit. Therefore, an erroneous operation of the decoder circuit caused by the parasitic capacitors can be avoided without increasing the access time and power consumption thereof.

21 Claims, 5 Drawing Sheets

DECODER CIRCUIT OF ERASABLE PROGRAMMABLE READ ONLY MEMORY FOR AVOIDING ERRONEOUS OPERATION CAUSED BY PARASITIC CAPACITORS

BACKGROUND OF THE INVENTION

1. Field of the Invention

The present invention relates to a decoder circuit, more particularly, to a decoder circuit of a programmable read only memory (which includes, for example, an erasable programmable read only memory: EPROM or a one time programmable read only memory: OT-PROM) having a plurality of floating gate avalanche injection MOS (FAMOS) transistors as memory cells.

2. Description of the Related Art

Generally, an EPROM comprises a cell matrix portion (memory cell array) formed by a plurality of FAMOS transistors as memory elements (memory cells), bit lines and word lines for selecting a specific memory cell, and decoder circuit for driving them. In the decoder circuit of the EPROM, a power supply voltage is brought to a low voltage (for example, 5 volts) at the time of reading out (reading-out time), a memory cell corresponding to an address signal (of which the voltage value is, for example, at 0 volts or 5 volts) is selected and data is output therefrom. On the other hand, at the time of writing (writing time), the power supply voltage is brought to a high voltage (for example, 12.5 volts), and the writing operation is carried out thereby. Namely, the memory cell of a FAMOS transistor is written by using the high voltage of 12.5 volts.

Recently, a decoder circuit of an EPROM comprising a NAND gate circuit including a load transistor and a plurality of decoder transistors and a CMOS inverter circuit receiving an output of the NAND gate circuit is proposed (which is, for example, disclosed in Japanese Unexamined Patent Publication No. 61-45496). In this decoder circuit, a booster circuit for a writing operation is not provided between the NAND gate circuit and the CMOS inverter circuit, as the NAND gate circuit comprises the load transistor used as a constant current source and is supplied with a power supply voltage changeable between a high voltage Vpp (12.5 volts) and a low voltage Vcc (5 volts). Namely, in the case of writing of the EPROM, an output of the NAND gate circuit of this decoder circuit is already at a high voltage level Vpp by receiving the high voltage Vpp, and thus the booster circuit for boosting an output (which is at a low voltage level Vcc) of a conventional NAND gate circuit to a high voltage level Vpp is not required. Therefore, this decoder circuit (for example, shown in JPP'496) is preferable for a large scale integration of an EPROM, as the booster circuit is not required.

Incidentally, in the NAND gate circuit, a plurality of parasitic capacitors are formed at connection points among the decoder transistors. Note, the ability to supply the current of the load transistor is not large, and thus in the case of a plurality of parasitic capacitors being charged, a potential drop at the output of the NAND gate circuit is caused and an erroneous operation of the EPROM may be caused (which is described in later in detail).

SUMMARY OF THE INVENTION

It is an object of the present invention to provide a decoder circuit of an EPROM for avoiding an erroneous operation of the decoder circuit caused by parasitic capacitors without increasing an access time and a power consumption thereof.

According to the present invention, there is provided a decoder circuit, used in a programmable read only memory, comprising: a first high potential power supply line for supplying a voltage changeable between a high voltage and a low voltage; a low potential power supply line; a load unit connected between the first high potential power supply line and a decoded output terminal; a plurality of decoder transistors, connected in series between the decoded output terminal and the low potential power supply line, and gates of the decoder transistors being supplied with input signals; a current supply unit, connected to at least one of a plurality of connection points of the decoder transistors, for supplying a current to the at least one of the connection points, when at least one of the decoder transistors except the nearest decoder transistor of the decoded output terminal is switched OFF.

The current supply unit may be connected to one point of the plurality of connection points. The current supply unit may be connected to the nearest connection point of the decoded output terminal in the connection points.

The decoder transistors may be formed by first conduction type MOS transistors; and the current supply unit may comprise a plurality of current supply transistors formed by second conduction type MOS transistors opposite to the first conduction type, sources of the current supply transistors may be connected to a second high potential power supply line for supplying the low voltage, drains of the current supply transistors may be connected to at least one of the connection points, and gates of the current supply transistors may be supplied with the input signals except the nearest input signal received by the nearest decoder transistor of the decoded output terminal.

All of the drains of the current supply transistors may be commonly connected to one point of the plurality of connection points. All of the drains of the current supply transistors may be commonly connected to the nearest connection point of the decoded output terminal in the connection points. Each of the drains of the current supply transistors may be respectively connected to corresponding connection points, and when a specific decoder transitor is switched OFF, the connection points from the specific decoder transistor to the decoded output terminal may be supplied with a current by the current supply transistors in accordance with the input signals except the nearest input signal. The corresponding connection points may be determined as drains of the decoder transistors whose gates are supplied with the same input signals except the nearest input signal of the decoded output terminal supplied to the gates of the current supply transistors. The load unit may be used as a constant current source. The load unit may be formed by a depletion mode n-channel MOS transistor.

Furthermore, according to the present invention, there is also provided a programmable read only memory, comprising: a cell matrix portion, having a plurality of word lines, a plurality of bit lines, and a plurality of memory cells connected between each of the word lines and each of the bit lines; a column decoder, connected to the cell matrix portion through the bit lines, for selecting one of the bit lines in accordance with address signals; a row decoder, connected to the cell matrix portion through the word lines, for selecting one of the word lines in accordance with address signals; a sense amplifier, connected to the cell matrix portion through the bit lines, for sensing a content of the selected memory cell; a data input buffer and program control circuit, connected to the cell matrix portion through the bit lines, for storing write data and supplying the write date to the cell matrix portion; an output enable and chip enable circuit, connected to the data input buffer and program control circuit, the column decoder, the row decoder, and the sense amplifier, for controlling them; and a high potential power supply unit, for selectively supplying a high voltage and a low voltage between a writing time and a reading-out time through a high potential power supply line; wherein the row decoder includes a decoder circuit comprising: a low potential power supply line; a load unit connected between the first high potential power supply line and a decoded output terminal; a plurality of decoder transistors, connected in series between the decoded output terminal and the low potential power supply line, and gates of the decoder transistors being supplied with input signals; a current supply unit, connected to at least one of a plurality of connection points of the decoder transistors, for supplying a current to the at least one of the connection points, when at least one of the decoder transistors except the nearest decoder transistor of the decoded output terminal is switched OFF.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments, a decoder circuit according to the prior art and the problems thereof will be explained with reference to FIGS. 1 and 2.

Figure 1:
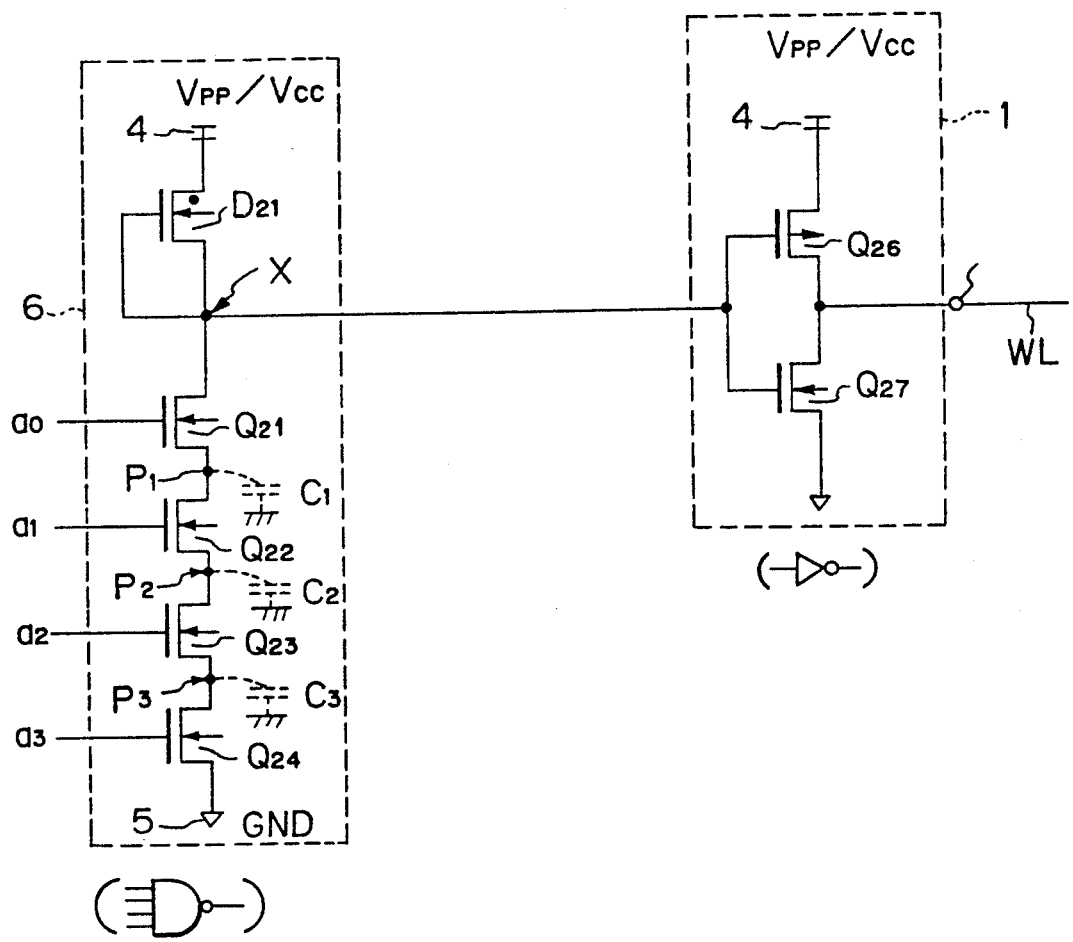
FIG. 1 is a circuit diagram illustrating a conventional decoder circuit according to the prior art.

FIG. 1 is a circuit diagram illustrating a conventional decoder circuit according to the prior art. In FIG. 1, a reference 1 denotes a CMOS inverter circuit, 3 denotes an output of the decoder circuit, or a word line output. Further, a reference 4 denotes a power supply line changeable between a high voltage (Vpp) and a low voltage (Vcc), 5 denotes a ground line, and 6 denotes a NAND gate circuit.

The decoder circuit comprises the NAND gate circuit 6 and the CMOS inverter circuit 1. The NAND gate circuit 6 comprises a depletion mode n-channel MOS transistor (load transistor) $D_2$, and a plurality of enhancement mode n-channel MOS transistors (decoder transistors) $Q_{21} \sim Q_{24}$. The CMOS inverter circuit 1 comprises an enhancement mode p-channel MOS transistor $Q_{26}$ and an enhancement mode n-channel MOS transistors $Q_{27}$.

The load transistor $D_2$ is connected between the high potential power supply line 4 and a decoded output terminal X, and the decoder transistors $Q_{21} \sim Q_{24}$ are connected in series between the decoded output terminal X and the low potential power supply line 5. Gates of the decoder transistors $Q_{21} \sim Q_{24}$ are supplied with input signals $a_0 \sim a_3$. Note, the input signals $a_0 \sim a_3$ may be address signals or predecoded address signals. Further, references $P_1 \sim P_3$ denote connection points (interconnection points) among the decoder transistors $Q_{21} \sim Q_{24}$, and $C_1 \sim C_3$ denote parasitic capacitors which are parasitically formed at the connection points $P_1 \sim P_3$.

The decoded output terminal X, which is an output of the NAND gate circuit 6, is connected to an input of the CMOS inverter circuit 1. An output of the CMOS inverter circuit 1, which is an output 3 of the decoder circuit, is connected to a word line WL of the memory cell array in the EPROM.

In this decoder circuit, the load transistor $D_2$ of the NAND gate circuit 6 is a depletion mode transistor, and is used as a constant current source. Note, a power supply voltage of the NAND gate circuit 6 and the CMOS inverter circuit 1 is to a high voltage Vpp (12.5 volts) at the writing time, and is changed to a low voltage Vcc (5 volts) at the reading-out time.

Recently, the semiconductor memory device (EPROM), the number of address signals, or the number of input bits, are increased in accordance with enlarging the capacity of the memory, so that the number of transistors constituting the NAND gate circuit 6 becomes large. Therefore, in the conventional decoder circuit, it is found that an erroneous operation of the decoder circuit is caused by the parasitic capacitors $C_1 \sim C_3$ which are indicated by a broken line in FIG. 1. This erroneous operation of the decoder circuit will be explained with reference to FIG. 2.

Figure 2:
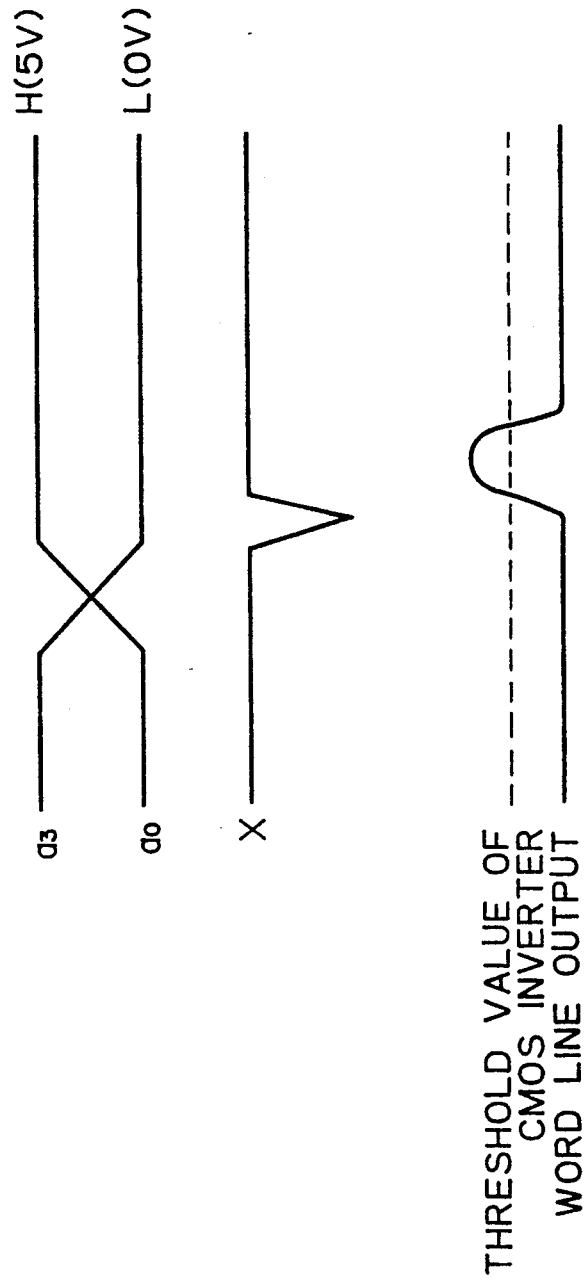
FIG. 2 is a diagram illustrating waveforms for explaining an erroneous operation in the conventional decoder circuit shown in FIG. 1.

FIG. 2 is a diagram illustrating waveforms for explaining an erroneous operation in the conventional decoder circuit shown in FIG. 1. In FIG. 2, references $a_0$ and $a_3$ denote voltage levels of input signals, and a reference X denotes an input voltage level of the CMOS inverter circuit 1. Note, a power supply voltage is determined at 5 volts at the reading-out time.

In the reading-out operation of the conventional EPROM, as shown in FIG. 2, when the input signal $a_0$ is at a low level "L" (0 volts) and the input signals $a_1 \sim a_3$ are at high levels "H" (5 volts), that is, when the gate of the decoder transistor $Q_{21}$ is supplied with the low level signal "L" and the gates of the decoder transistors $Q_{22} \sim Q_{24}$ are supplied with the high level signals "H", the decoder transistor $Q_{21}$ is switched OFF and the decoder transistors $Q_{22} \sim Q_{24}$ are switched ON. Therefore, the decoded output terminal X (X-point) is at a high level "H", and an output of the CMOS inverter circuit 1, which is a word line output, is at a low level "L". Note, in the NAND gate circuit 6, the decoder transistor $Q_{21}$ is maintained at the switched OFF state, and the decoder transistors $Q_{22} \sim Q_{24}$ are maintained at the switched ON states, and thus electric charges of the parasitic capacitors $C_1 \sim C_3$ are discharged to ground GND (low potential power supply line 5).

Thereafter, when changing the input signal $a_0$ to a high level "H" and changing the input signal $a_3$ to a low level "L", or when the input signals $a_0 \sim a_2$ are at high levels "H" and the input signal $a_3$ is at a low level "L", that is, when the gates of the decoder transistors $Q_{21} \sim Q_{23}$ are supplied with the high level signals "H" and the gate of the decoder transistor $Q_{24}$ is supplied with the low level signal "L", the decoder transistor $Q_{21} \sim Q_{23}$ are switched ON and the decoder transistor $Q_{24}$ is switched OFF. Note, at this moment, a current is flown from the load transistor $D_2$ to the parasitic capacitors $C_1 \sim C_3$ which are parasitically formed at connection points $P_1 \sim P_3$, so that the parasitic capacitors $C_1 \sim C_3$ are charged. Nevertheless, the ability to supply the current from the load transistor $D_2$ is so small that a potential at the point X, or an input voltage of the CMOS inverter circuit 1 is instantaneously dropped. This potential drop becomes larger in accordance with the number of decoder transistors constituting the NAND gate circuit 6.

Note, as shown in FIG. 2, the output of the CMOS inverter circuit 1, which is a word line output, is changed from a low level "L" to a high level "H", and a select level signal for selecting a memory cell is instantaneously output by the momentary potential drop. Consequently, a word line, which is not originally required to be selected, is selected as an error by the above described momentary potential drop, that is, an erroneous operation is caused in the EPROM by the parasitic capacitors $C_1 \sim C_3$ formed at the connection points $P_1 \sim P_3$ among the decoder transistors $Q_{21} \sim Q_{24}$. In order to avoid the above erroneous operation of the EPROM, a sense operation should be carried out after the parasitic capacitors $C_1 \sim C_3$ are fully charged. However, in accordance with this approach, an operation time from inputting an address to outputting data becomes long, for example, an access time is delayed about 20 nsec.

Furthermore, in the case of decreasing a resistor value of the load transistor $D_2$ to rapidly charge the parasitic capacitors $C_1 \sim C_3$, the power consumption of the decoder circuit becomes large.

Below, the preferred embodiments of a decoder circuit according to the present invention will be explained, with reference to FIGS. 3 to 5.

Figure 3:
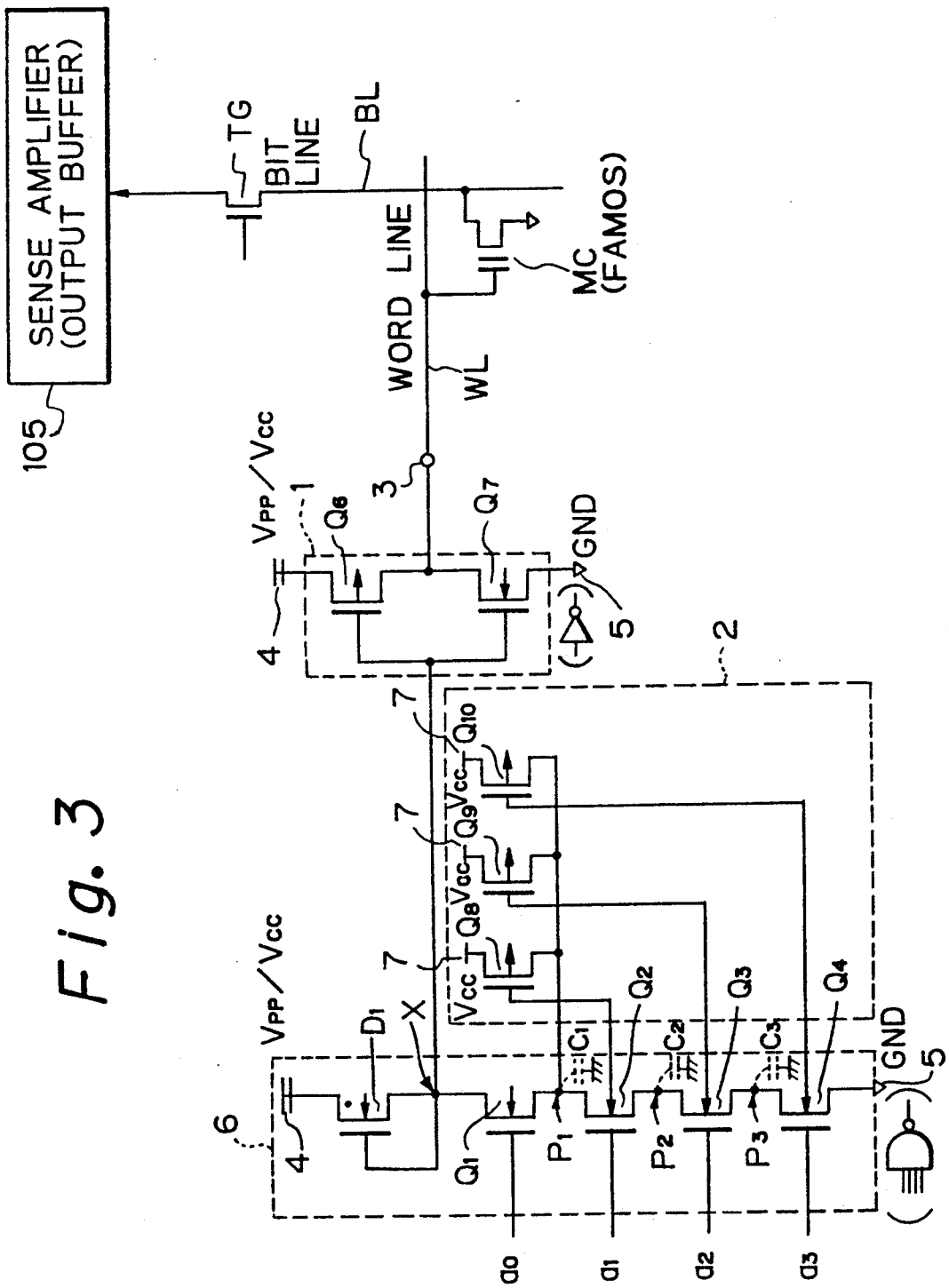
FIG. 3 is a circuit diagram illustrating a first embodiment of a decoder circuit according to the present invention.

FIG. 3 is a circuit diagram illustrating a first embodiment of a decoder circuit according to the present invention. A first embodiment of a decoder circuit (word line decoder circuit formed in a row decoder 104 in FIG. 5) in an EPROM will be explained with reference to FIG. 3. Note, the decoder circuit of the present invention is not only applied to an EPROM (erasable programmable read only memory), but also applied to an OTPROM (one time programmable read only memory).

In FIG. 3, a reference 1 denotes a CMOS inverter circuit, 2 denotes a current supply circuit, and 3 denotes an output of the decoder circuit, or a word line output. Further, a reference 4 denotes a power supply line changeable between a high voltage (Vpp) and a low voltage (Vcc), 5 denotes a ground line, and 6 denotes a NAND gate circuit. Note, the power supply line 4 is brought to a high voltage Vpp (12.5 volts) at the writing time, and is brought to a low voltage Vcc (5 volts) at the reading-out time.

The decoder circuit comprises the NAND gate circuit 6, the CMOS inverter circuit 1, and the current supply circuit 2. The NAND gate circuit 6 comprises a depletion mode n-channel MOS transistor (load transistor) $D_1$, and a plurality of enhancement mode n-channel MOS transistors (decoder transistors) $Q_1 \sim Q_4$. The CMOS inverter circuit 1 comprises an enhancement mode p-channel MOS transistor $Q_6$ and an enhancement mode n-channel MOS transistors $Q_7$. The current supply circuit 2 comprises a plurality of enhancement mode p-channel MOS transistors (current supply transistors) $Q_8 \sim Q_{10}$.

The load transistor $D_1$ is connected between the high potential power supply line 4 and a decoded output terminal X, and the decoder transistors $Q_1 \sim Q_4$ are connected in series between the decoded output terminal X and the low potential power supply line 5. Gates of the decoder transistors $Q_1 \sim Q_4$ are supplied with input signals $a_0 \sim a_3$, and further, gates of the power supply transistors $Q_8 \sim Q_{10}$ are supplied with the input signals $a_1 \sim a_3$. Namely, the decoder transistor $Q_2$ and the power supply transistor $Q_8$ are controlled by the input signal $a_1$, the decoder transistor $Q_3$ and the power supply transistor $Q_9$ are controlled by the input signal $a_2$, and the decoder transistor $Q_4$ and the power supply transistor $Q_{10}$ are controlled by the input signal $a_3$. Furthermore, sources of the power supply transistors $Q_8 \sim Q_{10}$ are connected to a power supply line 7 for only supplying a low voltage Vcc (5 volts), and drains of the power supply transistors $Q_8 \sim Q_{10}$ are connected to a connection point $P_1$. Note, the input signals $a_0 \sim a_3$ are address signals, or the signals generated by predecoding the address signals. Further, voltage levels of the input signals $a_0 \sim a_3$ supplied to the gates of the decoder transistors $Q_1 \sim Q_4$ are determined at high levels "H" (5 volts) or low levels "L" (0 volts). Additionally, references $P_1 \sim P_3$ denote connection points (interconnection points) among the decoder transistors $Q_1 \sim Q_4$, and $C_1 \sim C_3$ denote parasitic capacitors which are parasitically formed at the connection points $P_1 \sim P_3$.

The decoded output terminal X, which is an output of the NAND gate circuit 6, is connected to an input of the CMOS inverter circuit 1. An output of the CMOS inverter circuit 1, which is an output 3 of the decoder circuit, is connected to a word line WL of the memory cell array in the EPROM. A configuration of the EPROM including the decoder circuit will be explained after with reference to FIG. 5.

In this decoder circuit, the load transistor $D_1$ of the NAND gate circuit 6 is a depletion mode transistor, and is used as a constant current source. Note, a power supply voltage of the NAND gate circuit 6 and the CMOS inverter circuit 1 is set to a high voltage Vpp (12.5 volts) at the writing time, and is changed to a low voltage Vcc (5 volts) at the reading-out time.

Note, in this embodiment, for simplifying the explanation, it is assumed that there are four input signals $a_0 \sim a_3$, however, in practical application, there are, for example, 2048 input signals. Namely, as shown in FIG. 5, it is assumed that are, for example, 11 address signals ($A_8 \sim A_{18}$) input to a row decoder 104 of an EPROM, and there are, for example, 2048 ($2^{11}$) input signals ($a_0 \sim a_3$) for the decoder circuit. Therefore, in practical application, there can be plural address signals, and the number of decoder transistors is plural in accordance with the number of the address signals.

Below, a processes for avoiding an erroneous operation in the decoder circuit of the first embodiment will be explained.

First, an operation at the reading-out time of this first embodiment of the decoder circuit will be described.

When the input signal $a_0$ is at a low level "L" (0 volts) and the input signals $a_1 \sim a_3$ are at high levels "H" (5 volts), that is, when the gate of the decoder transistor $Q_1$ is supplied with the low level signal "L" and the gates of the decoder transistors $Q_2 \sim Q_4$ are supplied with the high level signals "H", the decoder transistor $Q_1$ is switched OFF and the decoder transistors $Q_2 \sim Q_4$ are switched ON. Therefore, the decoded output terminal X (X-point) is at a high level "H", and an output of the CMOS inverter circuit 1, which is a word line output, is at a low level "L". Note, in the NAND gate circuit 6, the decoder transistor $Q_1$ is maintained at the switched OFF state, and the decoder transistors $Q_2 \sim Q_4$ are maintained at the switched ON states, and thus electric charges of the parasitic capacitors $C_1 \sim C_3$ are discharged to ground GND (low potential power supply line 5). In this case, the current supply circuit 2 does not supply a current to the connection point $P_1$, since all of the current supply transistors $Q_8 \sim Q_{10}$ are switched OFF.

Thereafter, when changing the input signal $a_0$ to a high level "H" and changing the input signal $a_3$ to a low level "L", or when the input signals $a_0 \sim a_2$ are at high levels "H" and the input signal $a_3$ is at a low level "L", that is, when the gates of the decoder transistors $Q_1 \sim Q_3$ are supplied with the high level signals "H" and the gate of the decoder transistor $Q_{24}$ is supplied with the low level signal "L", the decoder transistor $Q_1 \sim Q_3$ are switched ON and the decoder transistor $Q_4$ is switched OFF. Note, at this moment, a current is flown from the load transistor $D_1$ to the parasitic capacitors $C_1 \sim C_3$ which are parasitically formed at connection points $P_1 \sim P_3$, so that the parasitic capacitors $C_1 \sim C_3$ are charged. Furthermore, the current supply transistor $Q_{10}$ is switched ON, as the input signal $a_3$ is at a low level "L", and a current from the current supply transistor $Q_{10}$ is supplied to the parasitic capacitors $C_1 \sim C_3$ through the connection point $P_1$, so that the parasitic capacitors $C_1 \sim C_3$ are charged by currents of load transistor $D_1$ and the current supply transistor $Q_{10}$ (current supply circuit 2).

As described above, according to the first embodiment of the decoder circuit according to the present invention, a charge operation of the parasitic capacitors $C_1 \sim C_3$ is not only carried out by the load transistor $D_1$, but also by the current supply transistors $Q_8 \sim Q_{10}$ (current supply circuit 2). Therefore, a potential drop of the decoded output terminal X (X-point), or an instantaneous drop of an output voltage of the CMOS inverter circuit 1 can be reduced, so that a nonselected word line being instantaneously selected in an erroneous operation is avoided.

Furthermore, when the input signals $a_0 \sim a_3$ are changed from levels "L", "H", "H", "H" to levels "H", "L", "H", "L", the decoder transistors $Q_2$ and $Q_4$ are switched OFF. In this case, the current supply transistors $Q_8$ and $Q_{10}$ are switched ON, and the parasitic capacitor $C_1$ is charged by currents of the load transistor $D_1$ and the current supply transistors $Q_8$ and $Q_{10}$ (current supply circuit 2), so that an instantaneous potential drop of the X-point can be avoided in the same manner as described above.

Namely, even when the levels of the input signals $a_0 \sim a_3$ are changed, in the case that a decoder output of the X-point is at a nonselect level and a charge operation of the parasitic capacitors $C_1 \sim C_3$ is necessary, at least one of the input signals $a_0 \sim a_3$ is at a low level "L" and at least one of the current supply transistors $Q_8 \sim Q_{10}$ is switched ON, so that the parasitic capacitors $C_1 \sim C_3$ are charged by using both the load transistor $D_1$ and at least one of the current supply transistors $Q_8 \sim Q_{10}$ (current supply circuit 2).

In the above description, when the input signals $a_0 \sim a_3$ are at levels "L", "H", "H", "H", that is, the X-point is at a nonselect level, the transistors $Q_8 \sim Q_{10}$ are not switched ON, but the parasitic capacitors $C_1 \sim C_3$ are electrically cut from the X-point by the switched OFF decoder transistor $Q_1$. Therefore, in such a case, there is no problem with the parasitic capacitors.

Next, an operation at the writing time will be described.

At the writing time, voltages of the high power supply lines 4 are at high voltages Vpp (12.5 volts), that is, power supply voltages of the NAND gate circuit 6 and the CMOS inverter circuit 1 are brought to high voltages Vpp (12.5 volts). Therefore, a logical threshold value of the CMOS inverter circuit 1 is brought to about Vpp/2 (volts), that is, the logical threshold value of the CMOS inverter circuit 1 is higher than the reading-out time, even if a voltage of the X-point is instantaneously dropped by the charge operation of the parasitic capacitors $C_1 \sim C_3$, so that an erroneous operation is not caused.

Note, as the power supply voltage is at the high voltage Vpp (12.5 volts) and the low voltage Vcc (5 volts) is applied to the current supply transistors $Q_8 \sim Q_{10}$, for example, when the input signals $a_0 \sim a_3$ are at levels "H", "L", "L", "L", the current supply transistor $Q_8$ is switched ON, and the connection point $P_1$ which is a source of the transistor $Q_1$ is at about 5 volts. The transistor $Q_1$ is switched OFF by a gate-source voltage $V_{gs}$ having no potential difference, as the input signal $a_0$ is at 5 volts. Therefore, a current is not flown from a power supply line 4 of the high voltage Vpp to a power supply line 7 (Vcc) of the transistors $Q_8 \sim Q_{10}$ through the load transistor $D_1$, the decoder transistor $Q_1$, and the connection point $P_1$.

Consequently, at the writing time, there is no problem with the added transistors $Q_8 \sim Q_{10}$ constituting the current supply circuit 2 an influence on the NAND circuit 6.

As described above, in the first embodiment of the present invention, the output of the current supply circuit 2 is connected to the connection point $P_1$ between the decoder transistors $Q_1$ and $Q_2$, but the output of the current supply circuit 2 can be also connected to the connection points $P_2$ or $P_3$ between the decoder transistors $Q_2$ and $Q_3$ or $Q_3$ and $Q_4$. Note, in this case, the load transistor $D_1$ is required to have a sufficient current supply ability, so that an output of the CMOS inverter circuit 1 is inverted by exceeding a threshold voltage of the CMOS inverter circuit 1, when the parasitic capacitors closer to the load transistor $D_1$ than the connection point ($P_2$ or $P_3$) of the current supply circuit 2 are charged. Further, in the case that the output of the current supply circuit 2 is connected to the X-point, when the writing operation carried out, the voltage of the high power supply line 4 of the NAND gate circuit 6 is brought to a high voltage Vpp (12.5 volts), the voltage of the power supply line 7 of the current supply circuit 2 is at 5 volts (Vcc), and the input signals $a_0 \sim a_3$ are changed between 0 volts and 5 volts, so that a current may be flown from the high power supply line 4 to the power supply line 7 through the switched on current supply transistor and a latch operation may be caused thereby.

Therefore, the output of the current supply circuit 2 should not be connected to the X-point.

Next, a second embodiment of the present invention will be explained with reference to FIG. 4. FIG. 4 is a circuit diagram illustrating a second embodiment of a decoder circuit of the present invention. Note, a configuration of the decoder circuit shown in FIG. 4 is similar to that of the decoder circuit shown in FIG. 3.

Figure 4:
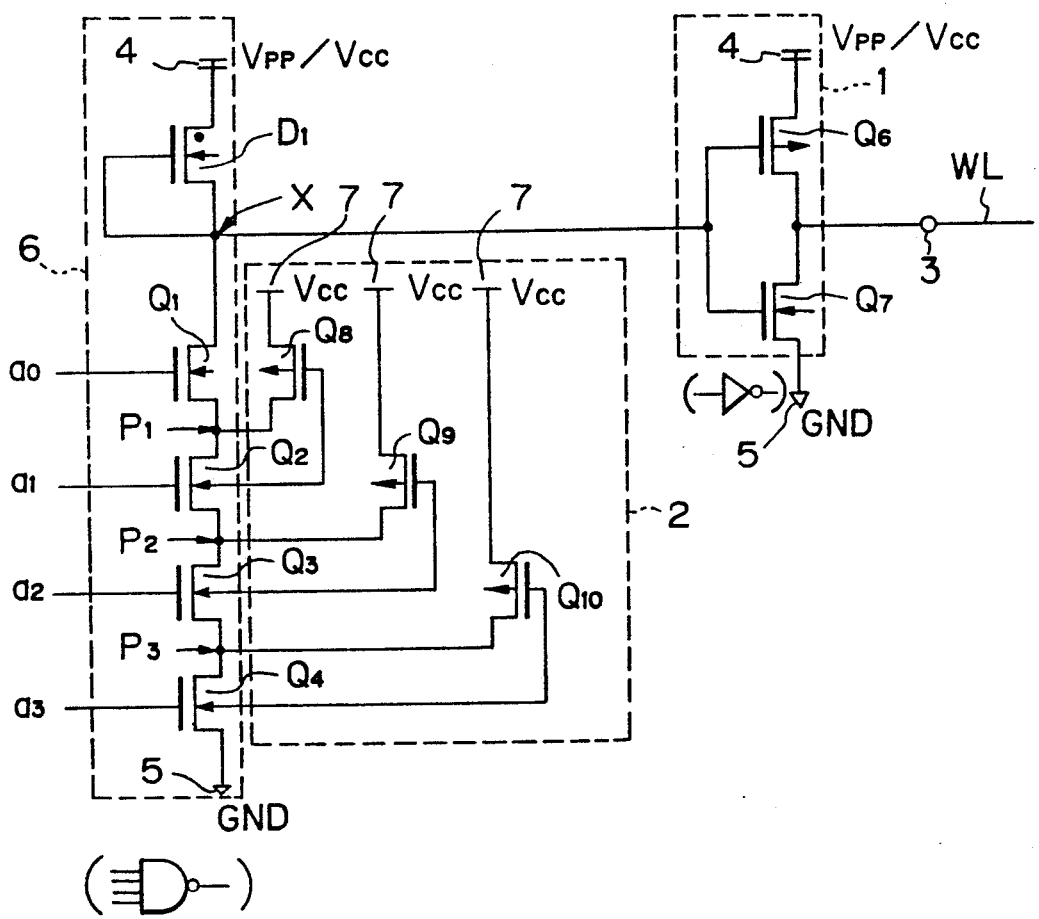
FIG. 4 is a circuit diagram illustrating a second embodiment of a decoder circuit of the present invention.

In FIG. 4, the same portions shown in FIG. 3 are indicated by the same references. The characteristics of the second embodiment is that drains of current supply transistors $Q_8 \sim Q_{10}$ constituting a current supply circuit 2 are connected to the connection points $P_1 \sim P_3$ among the decoder transistors $Q_1 \sim Q_4$ of the NAND gate circuit 6. The current supply transistors $Q_8 \sim Q_{10}$, which are formed by enhancement mode p-channel MOS transistors, constitute a current supply circuit 2.

In this decoder circuit of the second embodiment, when an address is changed from a nonselect address to another nonselect address, parasitic capacitors connected to drains of the switched OFF n-channel decoder transistors $Q_1 \sim Q_4$ are respectively charged by the switched ON p-channel current supply transistors $Q_8 \sim Q_{10}$.

Therefore, in the case that the input signals $a_0 \sim a_3$ are changed from levels "L", "H", "H", "H" to levels "H", "L", "H", "L", similar to the first embodiment, and the decoder transistors $Q_2$ and $Q_4$ are switched OFF, the parasitic capacitors $C_1$ and $C_3$ are supplied with currents from the switched ON current supply transistors $Q_8$ and $Q_{10}$, so that an instantaneous potential drop at an X-point X can be decreased. Note, in the above case, the parasitic capacitor $C_3$ is not concerned with the potential drop of the X-point, as the decoder transistor $Q_2$ is switched OFF, but when the input signals $a_0 \sim a_3$ are changed to levels "H", "H", "H", "L", the parasitic capacitor $C_3$ is already charged at that time. Therefore, in the second embodiment of the present invention, when the decoder transistors $Q_2 \sim Q_4$ constituting the NAND gate circuit 6 are switched OFF, the parasitic capacitors $C_1 \sim C_3$ connected to the drains of the transistors $Q_2 \sim Q_4$ are automatically charged by the current supply transistors $Q_8 \sim Q_{10}$.

As described above, when each of the parasitic capacitors $C_1 \sim C_3$ formed at the connection points $P_1 \sim P_3$ among the decoder transistors $Q_1 \sim Q_4$ is changed from a discharged state to a charged state, the parasitic capacitors $C_1 \sim C_3$ are not only charged by the load transistor $D_1$, but also charged by the current supply circuit 2, so that an output of the NAND gate circuit 6 (input voltage of the CMOS inverter circuit 1) is not instantaneously dropped. Therefore, when an address is changed, a select signal is not output at the time of originally outputting a nonselect signal, and an erroneous operation of the decoder circuit can be avoided.

Note, the decoder circuit of this embodiment includes larger number of elements for constituting a current supply circuit 2 than the conventional decoder circuit, but the p-channel transistors $Q_8 \sim Q_{10}$ and the transistors $Q_1 \sim Q_4$ can be arranged side by side (CMOS configuration), so that a width of the decoder circuit is not enlarged much more than that of the conventional decoder circuit.

Figure 5:
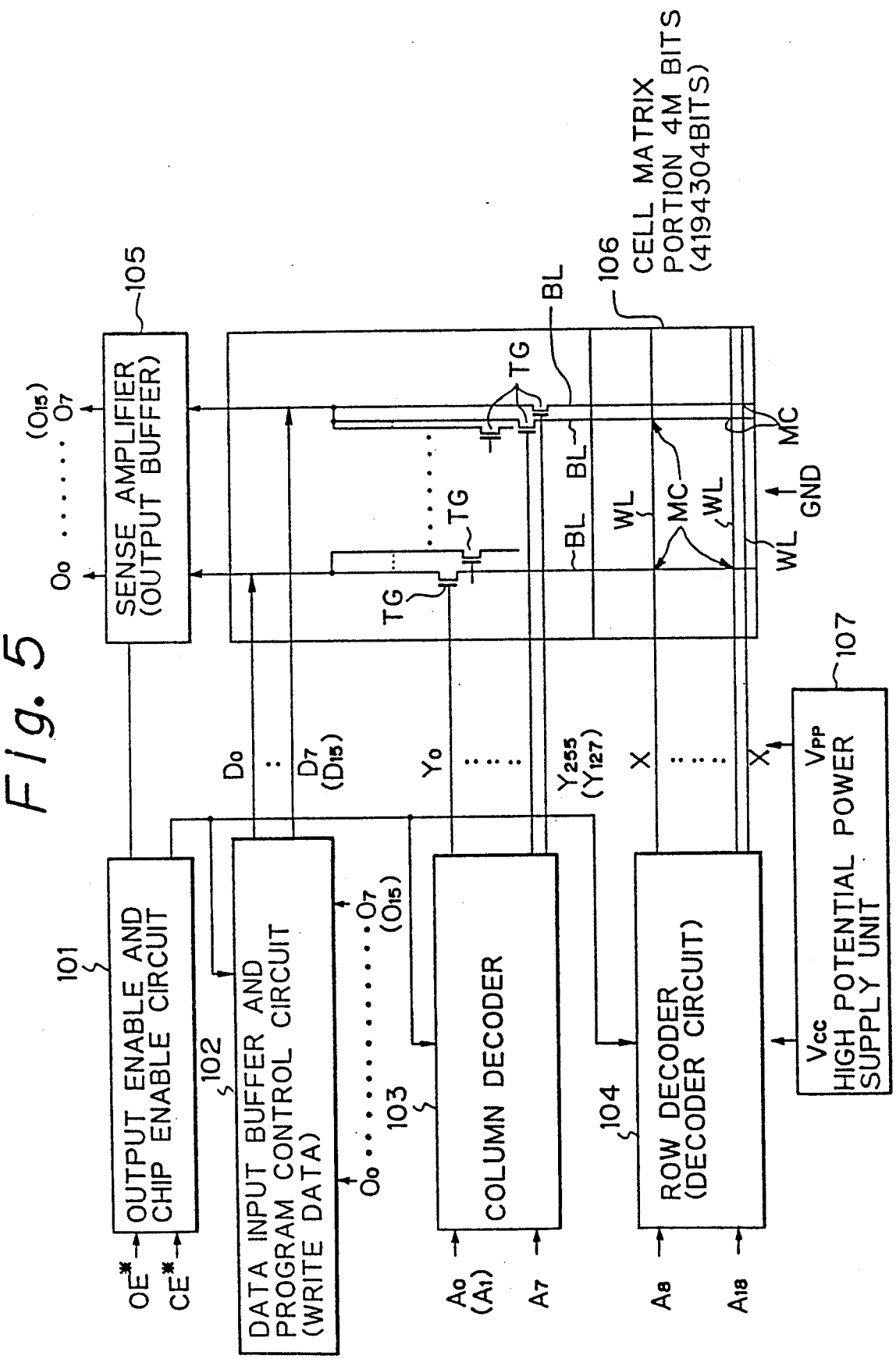
FIG. 5 is a circuit diagram illustrating an EPROM applying a decoder circuit of the present invention.

FIG. 5 is a circuit diagram illustrating an EPROM applying a decoder circuit of the present invention.

As shown in FIG. 5, an erasable programmable read only memory (EPROM) comprises a cell matrix portion 106, a column decoder 103, a row decoder 104, a sense amplifier 105, a data input buffer and program control circuit 102, an output enable and chip enable circuit 101, and a high potential power supply means 107. Note, the decoder circuit of the present invention is included in the row decoder 104. Furthermore, the decoder circuit of the present invention may be included in both the row decoder 104 and the column decoder 103.

As shown in FIGS. 3 and 5, the cell matrix portion 106 includes a plurality of word lines WL, a plurality of bit lines BL, and a plurality of memory cells MC connected between each of the word lines WL and each of the bit lines BL. Note, each of the memory cells MC is formed by a floating gate avalanche injection MOS transistor (FAMOS transistor). The column decoder 103 is connected to the cell matrix portion 106 through the bit lines BL, for selecting one of the bit lines in accordance with address signals $A_0 \sim A_7$. Concretely, signal lines from the column decoder 103 are connected to gates of transfer gate transistors TG, for controlling the connections between each of the memory cells MC in the cell matrix portion 106 and the sense amplifier (output buffer) 105. Note, the input signals $a_0 \sim a_3$ of the NAND gate circuit 6 are the address signals $A_8 \sim A_{18}$, or the signals generated by predecoding the address signals $A_8 \sim A_{18}$.

The row decoder 104 is connected to the cell matrix portion 106 through the word lines WL, for selecting one of said word lines in accordance with the address signals $A_8 \sim A_{18}$. As described above, the decoder circuit of the present invention is provided in the row decoder 104. The sense amplifier 105 is connected to the cell matrix portion 106 through the transfer gate transistors TG and the bit lines BL, for sensing a content of the selected memory cell MC. The data input buffer and program control circuit 102 is connected to the cell matrix portion 106 through the transfer gate transistors TG and the bit lines BL, for storing write data and supplying the write data to the cell matrix portion 106. The output enable and chip enable circuit 101 is connected to the data input buffer and program control circuit 102, the column decoder 103, the row decoder 104, and the sense amplifier 105, for controlling them. The high potential power supply unit 107 is used to selectively supply a high voltage Vpp and a low voltage Vcc between a writing time and a reading-out time through a high potential power supply line 4.

In the above description, the decoder circuit of the present invention is provided in the row decoder 104, as the number of decoder transistors in a NAND gate circuit (6) in the the row decoder 104 is plural, or the number of parasitic capacitors is to be plural, and an erroneous operation caused by the parasitic capacitors may be caused. Note, the number of the address signals of the column decoder 103 is fewer than that of the row decoder 104, or the number of the parasitic capacitors of a NAND gate circuit in the column decoder 103 is fewer than the row decoder 104, and an erroneous operation caused by the parasitic capacitors in the column decoder 103 is reduced from that in the row decoder 104. Nevertheless, the decoder circuit of the present invention need not be provided only in the row decoder 104, but also can be provided in the column decoder 103.

As described above, in the present invention, capacitors parasitically formed at the connection points among decoder transistors are not only charged by a current from a load transistor, but also charged by a current from a current supply circuit controlled by input signals. Therefore, an erroneous operation of the decoder circuit caused by the parasitic capacitors can be avoided without increasing an access time and a power consumption thereof.

Many widely differing embodiments of the present invention may be constructed without departing from the spirit and scope of the present invention, and it should be understood that the present invention is not limited to the specific embodiments described in this specification, except as defined in the appended claims.

I claim:

1. A decoder circuit, used in a programmable read only memory, comprising:
   a first high potential power supply line for supplying a voltage changeable between a high voltage and a low voltage;
   a low potential power supply line;
   a load means connected between said first high potential power supply line and a decoded output terminal;
   a plurality of decoder transistors, connected in series between said decoded output terminal and said low potential power supply line, and gates of said decoder transistors being supplied with input signals;
   a current supply means, connected to at least one of a plurality of connection points of said decoder transistors, for supplying a current to said at least one of said connection points, when at least one of said decoder transistors except the nearest decoder transistor of said decoded output terminal is switched OFF.

2. A decoder circuit, as claimed in claim 1, wherein said current supply means is connected to one point of said plurality of connection points.

3. A decoder circuit, as claimed in claim 2, wherein said current supply means is connected to the nearest connection point of said decoded output terminal in said connection points.

4. A decoder circuit, as claimed in claim 1, wherein said decoder transistors are formed by first conduction type MOS transistors; and
   said current supply means comprises a plurality of current supply transistors formed by second conduction type MOS transistors opposite to said first conduction type, sources of said current supply transistors are connected to a second high potential power supply line for supplying said low voltage, drains of said current supply transistors are connected to said at least one of said connection points, and gates of said current supply transistors are supplied with the input signals except the nearest input signal received by the nearest decoder transistor of said decoded output terminal.

5. A decoder circuit, as claimed in claim 4, wherein all of the drains of said current supply transistors are commonly connected to one point of said plurality of connection points.

6. A decoder circuit, as claimed in claim 5, wherein all of the drains of said current supply transistors are commonly connected to the nearest connection point of said decoded output terminal in said connection points.

7. A decoder circuit, as claimed in claim 4, wherein each of the drains of said current supply transistors is respectively connected to corresponding connection points, and when a specific decoder transitor is switched OFF, the connection points from said specific decoder transistor to said decoded output terminal are supplied with a current by said current supply transistors in accordance with the input signals except the nearest input signal.

8. A decoder circuit, as claimed in claim 7, wherein said corresponding connection points are determined as drains of said decoder transistors whose gates are supplied with the same input signals except the nearest input signal of said decoded output terminal supplied to the gates of said current supply transistors.

9. A decoder circuit, as claimed in claim 1, wherein said load means is used as a constant current source.

10. A decoder circuit, as claimed in claim 1, wherein said load means is formed by a depletion mode n-channel MOS transistor.

11. A decoder circuit, as claimed in claim 1, wherein said decoder circuit is provided in a row decoder of said programmable read only memory.

12. A programmable read only memory, comprising:
    a cell matrix portion, having a plurality of word lines, a plurality of bit lines, and a plurality of memory cells connected between each of said word lines and each of said bit lines;
    a column decoder, connected to said cell matrix portion through said bit lines, for selecting one of said bit lines in accordance with address signals;
    a row decoder, connected to said cell matrix portion through said word lines, for selecting one of said word lines in accordance with address signals;
    a sense amplifier, connected to said cell matrix portion through said bit lines, for sensing a content of the selected memory cell;
    a data input buffer and program control circuit, connected to said cell matrix portion through said bit lines, for storing write data and supplying said write date to said cell matrix portion;
    an output enable and chip enable circuit, connected to said data input buffer and program control circuit, said column decoder, said row decoder, and said sense amplifier, for controlling them; and
    a high potential power supply means, for selectively supplying a high voltage and a low voltage between a writing time and a reading-out time through a high potential power supply line;
    wherein said row decoder includes a decoder circuit comprising:
    a low potential power supply line;
    a load means connected between said first high potential power supply line and a decoded output terminal;
    a plurality of decoder transistors, connected in series between said decoded output terminal and said low potential power supply line, and gates of said decoder transistors being supplied with input signals;
    a current supply means, connected to at least one of a plurality of connection points of said decoder transistors, for supplying a current to said at least one of said connection points, when at least one of said decoder transistors except the nearest decoder transistor of said decoded output terminal is switched OFF.

13. A programmable read only memory, as claimed in claim 12, wherein said current supply means is connected to one point of said plurality of connection points.

14. A programmable read only memory, as claimed in claim 13, wherein said current supply means is connected to the nearest connection point of said decoded output terminal in said connection points.

15. A programmable read only memory, as claimed in claim 12, wherein said decoder transistors are formed by first conduction type MOS transistors;

said current supply means comprises a plurality of current supply transistors formed by second conduction type MOS transistors opposite to said first conduction type, sources of said current supply transistors are connected to a second high potential power supply line for supplying said low voltage, drains of said current supply transistors are connected to said at least one of said connection points, and gates of said current supply transistors are supplied with the input signals except the nearest input signal received by the nearest decoder transistor of said decoded output terminal.

16. A programmable read only memory, as claimed in claim 15, wherein all of the drains of said current supply transistors are commonly connected to one point of said plurality of connection points.

17. A programmable read only memory, as claimed in claim 16, wherein all of the drains of said current supply transistors are commonly connected to the nearest connection point of said decoded output terminal in said connection points.

18. A programmable read only memory, as claimed in claim 15, wherein each of the drains of said current supply transistors is respectively connected to corresponding connection points, and when a specific decoder transitor is switched OFF, the connection points from said specific decoder transistor to said decoded output terminal are supplied with a current by said current supply transistors in accordance with the input signals except the nearest input signal.

19. A programmable read only memory, as claimed in claim 18, wherein said corresponding connection points are determined as drains of said decoder transistors whose gates are supplied with the same input signals except the nearest input signal of said decoded output terminal supplied to the gates of said current supply transistors.

20. A programmable read only memory, as claimed in claim 12, wherein said load means is formed by a depletion mode n-channel MOS transistor.

21. A programmable read only memory, as claimed in claim 12, wherein each of said memory cells is formed by a floating gate avalanche injection MOS transistor.

* * * * *